(12) United States Patent
Nakaya

(10) Patent No.: US 8,189,365 B2
(45) Date of Patent: May 29, 2012

(54) SEMICONDUCTOR DEVICE CONFIGURATION METHOD

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 211 days.

(21) Appl. No.: 12/742,018

(22) PCT Filed: Sep. 9, 2008

(86) PCT No.: PCT/JP2008/066216
§ 371 (c)(1),
(2), (4) Date: May 7, 2010

(87) PCT Pub. No.: WO2009/066500
PCT Pub. Date: May 28, 2009

(65) Prior Publication Data
US 2010/0246240 A1 Sep. 30, 2010

(30) Foreign Application Priority Data

Nov. 21, 2007 (JP) ................................. 2007-301480

(51) Int. Cl.
*G11C 11/00* (2006.01)
*G11C 11/36* (2006.01)
(52) U.S. Cl. .......................... 365/148; 365/163; 365/175
(58) Field of Classification Search .................. 365/148, 365/163, 175
See application file for complete search history.

(56) References Cited

U.S. PATENT DOCUMENTS

| | | | | |
|---|---|---|---|---|
| 6,985,376 B2* | 1/2006 | Matsuoka | ...................... | 365/148 |
| 7,492,635 B2* | 2/2009 | Kim et al. | ...................... | 365/148 |
| 7,697,317 B2* | 4/2010 | Shimaoka et al. | ............ | 365/148 |
| 7,760,539 B2* | 7/2010 | Katoh | ............................ | 365/148 |
| 7,778,063 B2* | 8/2010 | Brubaker et al. | ............. | 365/148 |
| 7,817,457 B2* | 10/2010 | Tokiwa et al. | ................ | 365/148 |
| 7,826,249 B2* | 11/2010 | Toda | ............................ | 365/148 |
| 7,835,171 B2* | 11/2010 | Ono et al. | ...................... | 365/148 |
| 7,835,172 B2* | 11/2010 | Shinozaki | ..................... | 365/148 |
| 7,920,408 B2* | 4/2011 | Azuma et al. | ................. | 365/148 |
| 8,023,313 B2* | 9/2011 | Toda | ............................. | 365/148 |
| 8,102,697 B2* | 1/2012 | Toda | ............................. | 365/148 |

FOREIGN PATENT DOCUMENTS

| | | |
|---|---|---|
| JP | 2001-525606 A | 12/2001 |
| JP | 2002-076883 A | 3/2002 |
| JP | 2005-101535 A | 4/2005 |
| JP | 2006-295157 A | 10/2006 |
| JP | 2007-226883 A | 9/2007 |
| WO | 03/094227 A | 11/2003 |
| WO | 2006/070683 A | 7/2006 |
| WO | 2007/063655 A | 6/2007 |

OTHER PUBLICATIONS

International Search Report for PCT/JP2008/066216, mailed Nov. 18, 2008.

* cited by examiner

*Primary Examiner* — Trong Phan

(57) ABSTRACT

A plurality of three-terminal variable resistance switching elements each having a source electrode, a drain electrode, and a gate electrode are connected to each other in series. The source electrode of each of the three-terminal variable resistance switching elements and the drain electrode of its adjacent three-terminal variable resistance switching element are connected to each other through a wiring segment to form a lane. A potential holding section for holding a predetermined potential level is connected to the wiring segment. A column group is configured by selecting one of the three-terminal variable resistance elements in each lane. A common gate line is connected to each of the gate electrodes of the three-terminal variable resistance elements belonging to the column group.

14 Claims, 13 Drawing Sheets

11 Three-terminal variable resistance switching element

SEMICONDUCTOR DEVICE CONFIGURATION METHOD

TECHNICAL FIELD

The present invention relates to a configuration method for a semiconductor device which comprises a reconfigurable wiring network using variable-resistance switching elements.

BACKGROUND ART

Recently developed switching elements (see, for example, JP2005-101535A) can be programmably set to a high-resistance state and a low-resistance state, can store the set state in a non-volatile manner, and can exhibit a significantly low on-resistance as compared with a MOS transistor having the same footprint area (hereinafter referred to as the "variable resistance switching element").

FIG. 1 is a diagram showing an exemplary configuration of a variable resistance switching element.

Variable resistance switching element 10 shown in FIG. 1 comprises source electrode 20, drain electrode 21, and ion conduction layer 22. Source electrode 20 is an electrode for supplying a metal ion, and is made, for example, of copper or the like. Drain electrode 21 is an electrode which does not supply a metal ion, and is made, for example, of platinum or the like. Ion conduction layer 22 is made, for example, of tantalum oxide.

FIG. 2(a) is a diagram showing the operation of variable resistance switching element 10 shown in FIG. 1 when source electrode 20 is applied with write voltage Vp, and drain electrode 21 is set at voltage 0.

For making variable resistance switching element 10 conductive between source electrode 20 and drain electrode 21 from a shut-off state, source electrode 20 is applied with write voltage Vp, and drain electrode 21 is set to voltage 0, as shown in FIG. 2(a). In this way, precipitated metal 25 is precipitated from drain electrode 21 toward source electrode 20, and after the lapse of a certain time, variable resistance switching element 10 is made conductive between the two electrodes by the action of this precipitated metal 25.

FIG. 2(b) is a diagram showing the operation of variable resistance switching element 10 in the state shown in FIG. 2(a), when source electrode 20 is set to voltage 0, and drain electrode 21 is applied with voltage Vp.

To again bring the conduction between source electrode 20 and drain electrode 21 into a shut-off state, source electrode 20 is set to voltage 0, and drain electrode 21 is applied with voltage Vp, as shown in FIG. 2(b). When a certain time elapses in this state, the aforementioned precipitated metal 25 disappears, causing variable resistance switching element 10 to put both electrodes into shut-off state.

FIG. 3 is a diagram showing an exemplary configuration of a semiconductor device which comprises a reconfigurable wiring network using variable resistance switching elements 10 shown in FIG. 1.

The reconfigurable wiring network shown in FIG. 3 comprises wiring segments 4XY arranged in an array form, where wiring segments 4Xa, 4Xb, 4Xc, . . . arranged on the same axis in the horizontal direction are programmably coupled to adjacent wiring segments, respectively, through variable resistance switching elements 10Xa, 10Xb, 10Xc, . . . (where X, Y are variables representative of a, b, c, . . . ).

Assume that a lane refers to a sequence of wiring segments 4XY and variable resistance switching elements 10XY arranged on the same axis in the horizontal direction. FIG. 3 shows three exemplary lanes which include a lane extending from wiring segment 4aa to wiring segment 4ae, a lane extending from wiring segment 4ba to wiring segment 4be, and a lane extending from wiring segment 4ca to wiring segment 4ce.

Each variable resistance switching element 10XY is associated with MOS transistor 2XY, such that the source and drain of MOS transistor 2XY are connected to the respective electrodes of variable resistance switching element 10XY, respectively. MOS transistors 2aY, 2bY, 2cY, . . . arranged in the vertical direction have their gates connected to common gate line 3Y.

In the reconfigurable wiring network shown in FIG. 3, a configuration is set up in the following manner for setting the states of variable resistance switching elements 10XY in a desired pattern to connect or shut off wiring segments 4XY.

An OFF voltage is applied to the gate of a MOS transistor associated with variable resistance switching element 10XY for which a configuration is to be set up, to bring the MOS transistor into a shut-off state between its source and drain electrodes. Simultaneously, an ON voltage is applied to the gates of the remaining MOS transistors to bring them into a conductive state between their source and drain electrodes. Since a gate voltage is applied through gate line 3Y, MOS transistors 2XY are controlled ON/OFF in units of columns arranged in the vertical direction.

Next, when conduction state is to be established between the electrodes of variable resistance switching elements 10XY associated with MOS transistors 2XY which have been turned OFF, voltages are applied to both ends of an associated lane for state setup. Specifically, write voltage Vp is applied to a left end of the line, while a zero-voltage is applied to a right end of the same for bringing variable resistance switching element 10XY into a conductive state.

On the other hand, write voltage Vp is applied to the right end of the lane, while zero-voltage is applied to the left end of the same, to bring variable resistance switching element 10XY into a shut-off state.

Assume herein that the source electrode is positioned on the left side of variable resistance switching element 10XY, and the drain electrode is positioned on the right side of the same, as shown in FIG. 3. Notably, when it is not necessary to change the state of variable resistance switching element 10XY, both ends of an associated lane are set at the same voltage.

The operation in which variable resistance switching elements 10XY are configured is performed for every gate line 3Y. Specifically, all variable resistance switching elements 10XY corresponding to one gate line are subjected to the state setup at one time, and such an operation is sequentially performed for each gate line 3Y. In this way, the configuration is fully accomplished.

In the example described above, voltages are applied from both ends of a lane for configuring particular variable resistance switching elements 10XY, so that all variable resistance switching elements 10XY are provided with MOS transistors 2XY for bypassing them. While variable resistance switching element 10XY itself is very small as compared with MOS transistor 2XY, these MOS transistors 2XY for bypassing cause the circuit area of the overall semiconductor device to increase.

The semiconductor device and configuration method as described above imply a problem that a circuit area increases. This is because a MOS transistor must be provided for each variable resistance switching element for bypassing.

DISCLOSURE OF THE INVENTION

It is an object of the present invention to provide a semiconductor device configuration method which solves the aforementioned problem.

To achieve the above object, the present invention provides a configuration method for configuring a semiconductor device, wherein the semiconductor device comprises L (L is a natural number) lanes, where each of the lane includes a plurality of three-terminal variable resistance switching elements each having a source electrode, a drain electrode, and a gate electrode and that are connected to each other in series, wiring segments through which the three-terminal variable resistance switching element has the source electrode connected to the drain electrode of a three-terminal variable resistance element adjacent to the three-terminal variable resistance switching element; a plurality of potential holding sections connected to the wiring segments for holding a predetermined potential; and a common gate line connected to each of the gate electrodes of three-terminal variable resistance switching elements belonging to a column group, comprised of three-terminal variable resistance switching elements, each of which is arranged in each of the lanes. The configuration method comprises:

a first step of holding a first end on a source side of the each lane at a predetermined write voltage with respect to a second end on a drain side of each of the lanes to a moment at which conduction is established from the first end to the second end;

a second step of holding all the gate lines at the write voltage with respect to the first ends, subsequent to the first step;

a third step, subsequent to the second step, of holding the first end of a lane to which a desired three-terminal variable resistance switching element is connected and gate lines other than a gate line to which the desired three-terminal variable resistance switching element is connected at the write voltage, until a resistance value between the first end and the second end of the lane to which the desired three-terminal variable resistance switching element is connected grows to a larger value than a resistance value between the first end and the second end at the instant when conduction is established between the first end and the second end in the first step; and a fourth step of holding the gate line to which the desired three-terminal variable resistance switching element is connected at the write voltage, subsequent to the third step.

As described above, in the present invention, a bus holder or a pull-up resistor for preventing floating is shared for configuration of the variable resistance switching elements to eliminate the need for adding extra MOS transistors, so that a reconfigurable wiring network can be realized in a small area without requiring MOS transistors for bypassing.

Figure 10A:
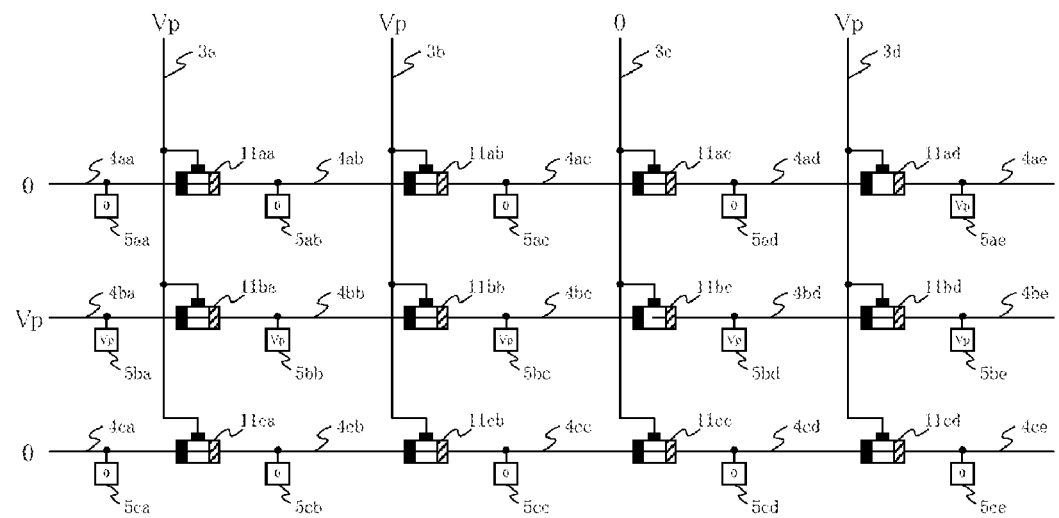
[FIG. 10(a)]
A diagram for describing the operation of the semiconductor device when the gate line corresponding to the three-terminal variable resistance switching element which is to be shut off is again set to zero-voltage, and the remaining gate lines are all set at write voltage Vp in the method of bringing the three-terminal variable resistance switching element into a shut-off state after a procedure described in FIGS. 9(a) and 9(b).

A diagram for describing the operation of the semiconductor device when the gate line of the three-terminal variable resistance switching element which is to be shut off, and a gate line to the right thereof are set to write voltage Vp, and the remaining gate lines and left ends of all the lanes are set to zero-voltage, in the state shown in FIG. 10(a).

[FIG. 11]

A diagram showing a semiconductor device which comprises a reconfigurable wring network which has the three-terminal variable resistance switching elements arranged in an irregular manner.

[FIG. 12]

Figure 4:
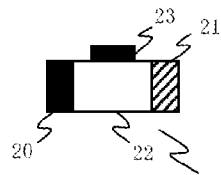
[FIG. 4]
A diagram showing an exemplary configuration of three-terminal variable resistance switching element for use in the present invention.

A diagram showing a second embodiment of a semiconductor device which comprises a reconfigurable wiring network using the three-terminal variable resistance switching elements shown in FIG. 4.

BEST MODE FOR CARRYING OUT THE INVENTION

In the following, embodiments of the present invention will be described with reference to the drawings.
(First Embodiment)

FIG. 4 is a diagram showing an exemplary configuration of a three-terminal variable resistance switching element for use in the present invention.

As shown in FIG. 4, three-terminal variable resistance switching element 11 comprises source electrode 20, drain electrode 21, ion conduction layer 22, and gate electrode 23.

Source electrode 20 is an electrode for supplying a metal ion, and is made, for example, of copper or the like. Drain electrode 21 is an electrode which does not supply a metal ion, and is made, for example, of platinum or the like. Ion conduction layer 22 is made, for example, of tantalum oxide. Gate electrode 23 is an electrode for supplying a metal ion, and is made of the same material as source electrode 20, for example, of copper or the like. Gate electrode 23 functions as a switch to bring source electrode 20 and drain electrode 21 into a conductive state or to put the electrodes into a shut-off state. Gate electrode 23 is provided for aiding in switching control, and a shut-off state prevails at all times between gate electrode 23 and source electrode 20 or drain electrode 21.

Figure 5A:
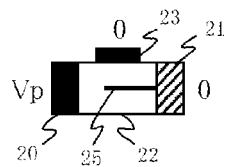
[FIG. 5(a)]
A diagram showing the operation of the three-terminal variable resistance switching element shown in FIG. 4 when its source electrode is applied with write voltage Vp, and its drain electrode and gate electrode are set to voltage 0.

FIG. 5(a) is a diagram showing the operation of three-terminal variable resistance switching element 11 shown in FIG. 4, when its source electrode 20 is applied with write voltage Vp, and its drain electrode 21 and gate electrode 23 are set at voltage 0.

To change from a shut-off state to a conductive state between the source and the drain, source electrode 20 is first applied with write voltage Vp, while drain electrode 21 and gate electrode 23 are set to voltage 0, as shown in FIG. 5(a). In this way, precipitated metal 25 is precipitated from drain electrode 21 toward source electrode 20. This state is held until the source and the drain are weakly interconnected by precipitated metal 25 or immediately before they are interconnected (weakly conductive state). This is a first stage.

Figure 5B:
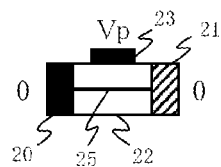
[FIG. 5(b)]
A diagram showing the operation of the three-terminal variable resistance switching element when the source electrode and drain electrode are both set to voltage 0, and the gate electrode is applied with write voltage Vp in the state shown in FIG. 5(a).

FIG. 5(b) is a diagram showing the operation of three-terminal variable resistance switching element 11 when source electrode 20 and drain electrode 21 are both set to zero-voltage, and gate electrode 23 is applied with write voltage Vp in the state shown in FIG. 5(a).

Next, source electrode 20 and drain electrode 21 are both set to zero-voltage, and gate electrode 23 is applied with write voltage Vp, as shown in FIG. 5(b). In this way, precipitated metal 25 further grows to make three-terminal variable resistance switching element 11 securely conductive between the source and the drain electrodes (strongly conductive state). The application of the voltages in FIG. 5(b) must be stopped before precipitated metal 25 reaches gate electrode 23. In other words, gate electrode 23 is held at write voltage Vp immediately before precipitated metal 25 reaches gate electrode 23 after the first stage. This is a second stage.

Next, a description will be given of a method of changing three-terminal variable resistance switching element 11 from a conductive state to a shut-off state between the source and the drain.

Figure 5C:
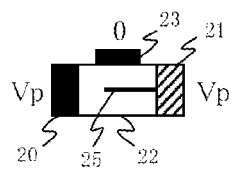
[FIG. 5(c)]
A diagram showing the operation of the three-terminal variable resistance switching element when the source electrode and drain electrode are applied with write voltage Vp, and gate electrode is set to voltage 0 in the state shown in FIG. 5(b).

FIG. 5(c) is a diagram showing the operation of three-terminal variable resistance switching element 11 when source electrode 20 and drain electrode 21 are applied with write voltage Vp, and the gate electrode is set to zero-voltage, in the state shown in FIG. 5(b).

First, source electrode 20 and drain electrode 21 are applied with write voltage Vp, while the gate electrode is set to zero-voltage, as shown in FIG. 5(c). This causes a reduction in precipitated metal 25, thus creating a weak shut-off state between the source and the drain electrodes (weak shut-off state). In this event, while metal bridging is blocked between the source and the drain, precipitated metal 25 still remains and does not completely disappear.

Figure 5D:
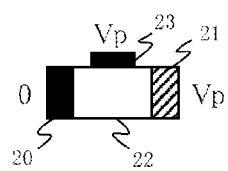
[FIG. 5(d)]
A diagram showing the operation of the three-terminal variable resistance switching element when the source electrode is set to zero-voltage, and the drain electrode and gate electrode are applied with write voltage Vp in the state shown in FIG. 5(c).

FIG. 5(d) is a diagram showing the operation of three-terminal variable resistance switching element 11 when source electrode 20 is set to zero-voltage, and drain electrode 21 and gate electrode 23 are applied with write voltage Vp in the state shown in FIG. 5(c).

Next, source electrode 20 is set to zero-voltage, while drain electrode 21 and gate electrode 23 are applied with write voltage Vp, as shown in FIG. 5(d). By maintaining this state for a certain time, precipitated metal 25 in ion conduction layer 22 completely disappears to sufficiently end conductive state between the source and the drain electrodes (strong shut-off state).

Three-terminal variable resistance switching element 11 shown in FIG. 4 is advantageous in that, with the use of gate electrode 23, and a smaller current is needed to establish a conductive or shut-off state between the source and the drain electrodes. This is because precipitated metal 25 is controlled with gate electrode 23 being blocked from the other electrodes at all times. Also advantageously, since the metal bridging can be securely established between the source and the drain electrodes by gate electrode 23, the resistance becomes very low when conduction is established between the source and the drain electrodes.

Notably, FIG. 4 schematically shows three-terminal variable resistance switching element 11, but the physical arrangement and structure of the electrodes and the like are not limited to those shown in FIG. 4. Three-terminal variable resistance switching element 11 for use in embodiments described below may be any one as long as it has the functions described with reference to FIGS. 5(a)-5(d).

Also, the aforementioned voltage values 0, Vp are such that their relative values alone are meaningful and their absolute values are arbitrary. Generally, write voltage Vp is higher than supply voltage Vdd in a normal mode when a circuit is operated.

Also, the weakly conductive state, used herein, refers to a conductive state in which the resistance value is larger than a predetermined threshold value between source electrode 20 and drain electrode 21. On the other hand, the strongly conductive state refers to a conductive state with the resistance value being smaller than the predetermined threshold value between source electrode 20 and drain electrode 21.

Also, the weak shut-off state, used herein, refers to a shut-off state with the resistance value being larger than that in the weakly conductive state between source electrode 20 and drain electrode 21. On the other hand, the strong shut-off state refers to a shut-off state with the resistance value being larger than that in the weak shut-off state between source electrode 20 and drain electrode 21.

Figure 6:
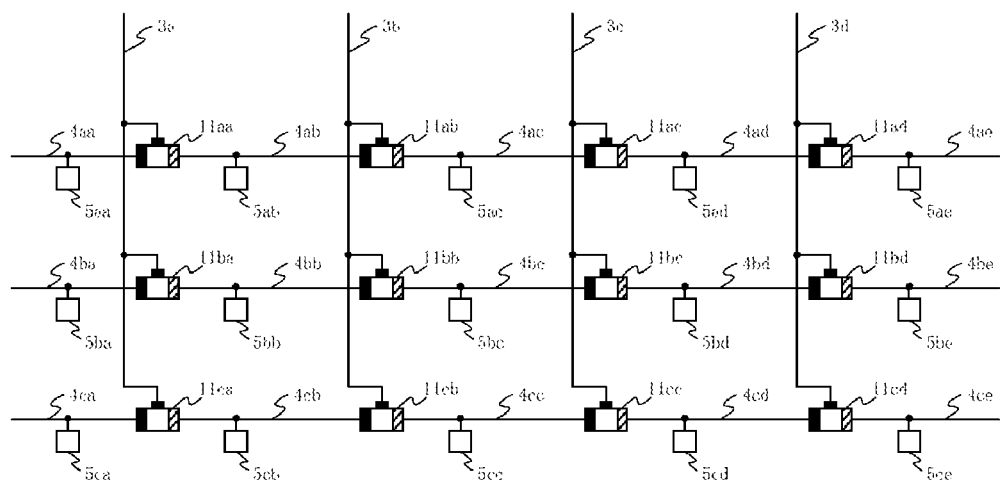
[FIG. 6]
A diagram showing a first embodiment of a semiconductor device which comprises a reconfigurable wiring network using the three-terminal variable resistance switching elements shown in FIG. 4.

FIG. 6 is a diagram showing a first embodiment of a semiconductor device which comprises a reconfigurable wiring network using three-terminal variable resistance switching elements 11 shown in FIG. 4.

As shown in FIG. 6, in the first embodiment of the semiconductor device which comprises a reconfigurable wiring network using three-terminal variable resistance switching elements 11 shown in FIG. 4, wiring segments 4XY are arranged in an array form. Wiring segments 4Xa, 4Xb, 4Xc, ... arranged on the same axis in the horizontal direction are programmably coupled to adjacent wiring segments 4XY, respectively, through three-terminal variable resistance switching elements 11Xa, 11Xb, 11Xc, 11Xd, ... (where, X, Y are variables representative of a, b, c, ... ). Here, respective groups including three-terminal variable resistance switching elements 11Xa, 11Xb, 11Xc, 11Xd are defined as column groups.

A lane refers to a sequence of wiring segments 4XY and three-terminal variable resistance switching elements 11XY arranged on the same axis in the horizontal direction. FIG. 6 shows three exemplary lanes which include a lane extending from wiring segment 4aa to wiring segment 4ae, a lane extending from wiring segment 4ba to wiring segment 4be, and a lane extending from wiring segment 4ca to wiring segment 4ce. While a semiconductor device comprised of three lanes is given herein as an example for purposes of description, the number of lanes may be L (L is a natural number). Also, the number of three-terminal variable resistance switching elements connected to each lane may be j (j is a natural number).

Here, all three-terminal variable resistance switches 11XY must be connected to wiring segments 4XY in the same orientation. FIG. 6 shows an example where each three-terminal variable resistance switching element 11XY has source electrode 20 connected to a left-hand wiring segment, and drain electrode 21 to a right-hand wiring segment. Here, a source end is defined to indicate the end of a wiring segment which is connected to source electrode 20 of three-terminal variable resistance switching element 11XY. Also, a drain end is defined to indicate the end of a wiring segment which is connected to drain electrode 21 of three-terminal variable resistance switching element 11XY.

Also, three-terminal variable resistance switching elements 11aY, 11bY, 11cY, ..., arranged in the vertical direction in each column, have their gate terminals 23 connected to common gate line 3Y. In other words, terminal variable resistance switching elements 11XY belonging to the same line group are connected to the same gate line 3Y. Specifically, three-terminal variable resistance switching elements up to an i-th one (i is a natural number from one to $N_j$) in a j-th lane (j is a natural number from one to L (L is a lane number)) belong to an (X_i_j)th column group, where X_i_j is an integer which satisfies X_i_j<X_(i+1)_j. Here, N is a natural number.

Also, bus holder 5XY is connected to each wiring segment 4XY.

Figure 7:
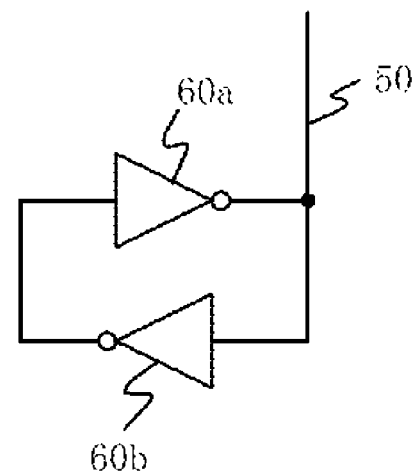
[FIG. 7]
An exemplary circuit of a bus holder shown in FIG. 6.

FIG. 7 is an exemplary circuit of bus holder 5XY shown in FIG. 6.

As shown in FIG. 7, bus holder 5XY shown in FIG. 6 is such that the output of inverter 60a is connected to the input of inverter 60b, and the output of inverter 60b is connected to the input of inverter 60a. Then, the output of inverter 60a serves as output terminal 50 of bus holder 5XY. Bus holder 5XY is a storage element for storing one-bit information, and holds therein a signal applied to output terminal 50 from another gate. In other words, bus holder 5XY is a potential holding section for holding the potential of a wire to which bus holder 5XY is connected. Because of a small driving force, both inverters 60a, 60b can be readily written from another gate, without substantial influences on signal propagation delay of a wire connected to output terminal 50. If a wire connected to output terminal 50 is not driven from another gate, a signal stored in bus holder 5XY determines the voltage level on this wire. Bus holder 5XY has a function of clamping a wire connected thereto to either logical 0 or 1 to prevent the voltage level from being an indefinite value.

In the following, a description will be given of a configuration method in the semiconductor device which comprises a reconfigurable wiring network, shown in FIG. 6. The configuration is made up of two stages of initialization and state setup. The initialization involves bringing all three-terminal variable resistance switching elements into a conductive state. The state setup in turn involves bringing some three-terminal variable resistance switches into a shut-off state in accordance with a predetermined pattern.

Figure 8A:
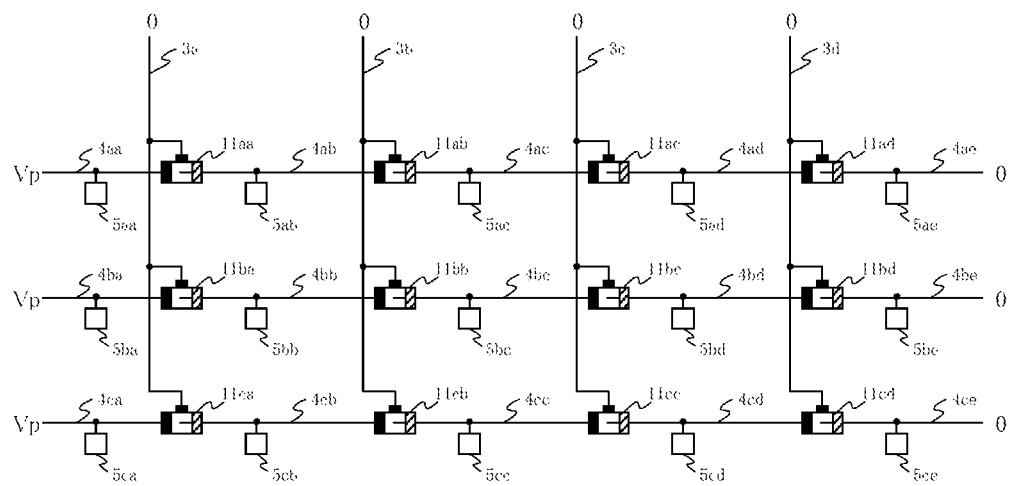
[FIG. 8(a)]
A diagram for describing the operation of the semiconductor device, which comprises a reconfigurable wiring network, shown in FIG. 6 when a first end on a source side is applied with write voltage Vp, and a second end on a drain side and a gate line are set to zero-voltage in initialization within a configuration method for the semiconductor device.

FIG. 8(a) is a diagram for describing the operation of the semiconductor device which comprises a configurable wiring network, shown in FIG. 6, when a first end on the source side is applied with write voltage Vp, and a second end on the drain side and gate line 3Y are set to zero-voltage in the initialization of the configuration method. This is a procedure for previously bringing all three-terminal variable resistance switching elements into a conductive state irrespective of the state in which each three-terminal variable resistance switching element stays.

First, a left end of each lane, i.e., the first end on the source side is applied with write voltage Vp (held at write voltage Vp), while a right end, i.e., the second end on the drain side and gate line 3Y are set to zero-voltage, as shown in FIG. 8(a). After this state continues for a little while, three-terminal variable resistance switching element 11XY in a shut-off state changes into a weakly conductive state, to establish conduction from the right end to the left end of the lane. At the instant when the conduction is established, the voltage at the left end of the lane is set to zero, thereby preventing a large current from flowing therethrough. In this way, all lanes are made conductive from the right end to the left end. Here, since the application of the write voltage is stopped at the instant when the conduction is established, some three-terminal variable resistance switching elements 11XY belonging to the lane may stay in a weakly conductive state. This is a first stage.

Figure 8B:
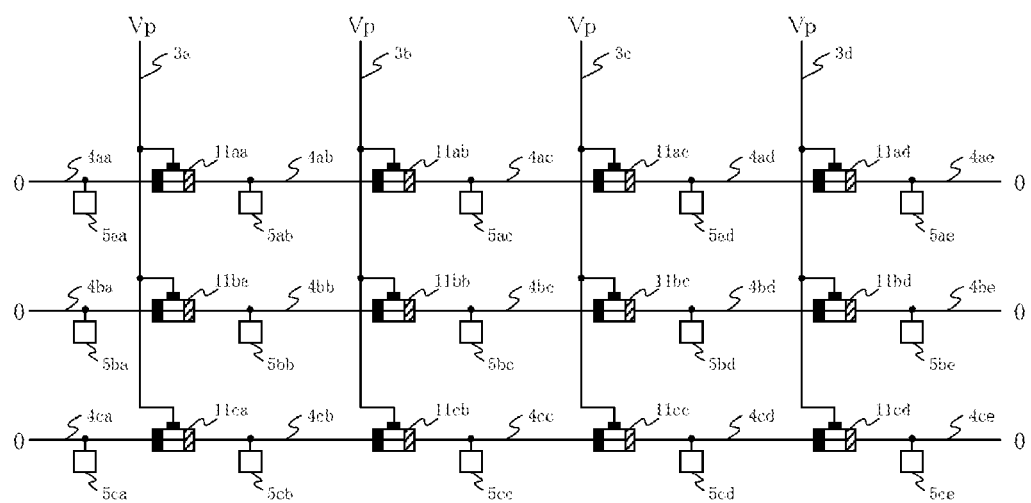
[FIG. 8(b)]
A diagram for describing the operation of the semiconductor device when each of both lane ends is set to voltage 0, and the gate line is held at write voltage Vp in the state shown in FIG. 8(b).

FIG. 8(b) is a diagram for describing the operation of the semiconductor device when both ends of each lane are set to voltage 0, and gate line 3Y is held at write voltage Vp in the state shown in FIG. 8(a).

Next, both ends of each lane are set to voltage 0, while gate line 3Y is held at write voltage Vp, as shown in FIG. 8(b). After the lapse of a certain period of time during which this state is maintained, the metal bridging of each three-terminal variable resistance switching element 11XY is enhanced to bring the same into a firmly conductive state. This is a second stage.

The foregoing stages are involved in the initialization. As shown in FIG. 8(a), the existence of bus holder 5XY is indispensable for applying a voltage to each terminal to bring all three-terminal variable resistance switching elements 11XY into a conductive state. The existence of bus holder 5XY allows wiring segment 4XY to take the voltage level 0 or Vp. When three-terminal variable resistance switching element 11XY is in a shut-off state with wiring segment 4XY to the left thereof being at voltage Vp and wiring segment 4XY to the right thereof being at voltage 0, precipitated metal 25 grows until three-terminal variable resistance switching element 11XY becomes weakly conductive. In this way, three-terminal variable resistance switching elements 11XY in the shut-off state, belonging to that lane, successively enter a weakly conductive state. Since the left end of the lane is at voltage Vp and the right end of the same is at voltage 0, shut-off three-terminal variable resistance switching element 11XY continues to change into a conductive state until three-terminal variable resistance switching element 11XY becomes thoroughly conductive from the left end to the right end.

Notably, if bus holder 5XY were not provided, the foregoing operation would not be ensured because wiring segment 4XY could be at an intermediate voltage level which is not Vp or 0 or at an indefinite level.

Next, a description will be given of a method of bringing three-terminal variable resistance switching elements 11XY into a shut-off state in accordance with a predetermined pattern.

Figure 9A:
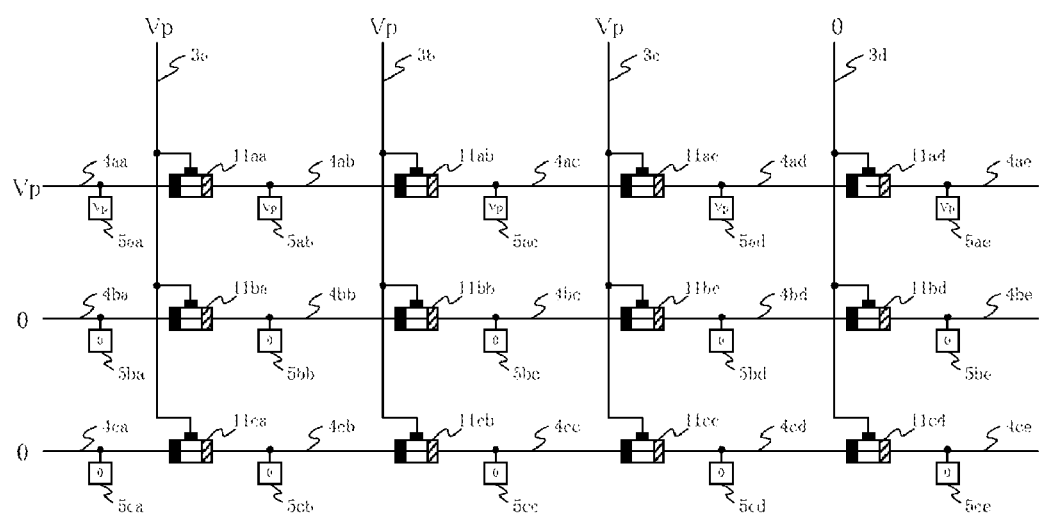
[FIG. 9(a)]
A diagram for describing the operation of the semiconductor device when a gate line corresponding to a three-terminal variable resistance switching element which is to be shut off is set to zero-voltage, and the remaining gate lines are all held at write voltage Vp, in a method of bringing the three-terminal variable resistance switching element shown in FIGS. 8(a)-8(b) into a shut-off state.

FIG. 9(a) is a diagram for describing the operation of the semiconductor device when gate line 3d corresponding to three-terminal variable resistance switching element 11ad, which is to be shut off, is set to zero-voltage, and the remaining gate lines are all held at write voltage Vp in a method of bringing three-terminal variable resistance switching element 11ad shown in FIGS. 8(a)-8(b) into a shut-off state.

First, gate line 3d corresponding to three-terminal variable resistance switching element 11ad, which is to be shut off, is set to zero-voltage, while the remaining gate lines are all held at write voltage Vp, as shown in FIG. 9(a). Simultaneously, write voltage Vp is applied to a left end of a lane including three-terminal variable resistance switching element 11ad which is to be shut off, and the left ends of the remaining lanes are set to voltage 0. After the lapse of a certain period of time during which this state is maintained, only three-terminal variable resistance switching element 11ad changes into a weakly shut-off state. In this event, bus holder 5ae positioned on the right side of three-terminal variable resistance switching element 11ad is holding voltage Vp. This is a third stage.

Figure 9B:
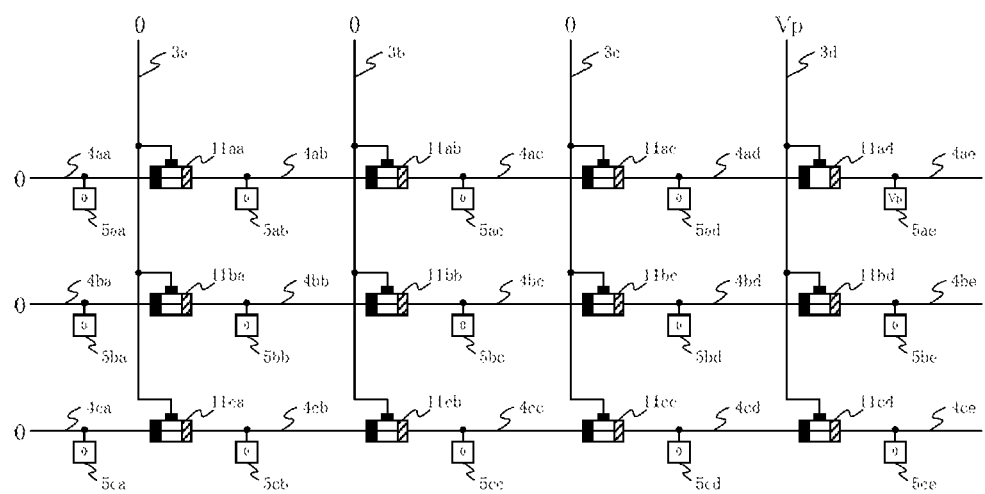
[FIG. 9(b)]
A diagram for describing the operation of the semiconductor device when the gate line is held at write voltage Vp, and gate lines other than the remaining gate lines and left ends of all lanes are held at zero-voltage in the state shown in FIG. 9(a).

FIG. 9(b) is a diagram for describing the operation of the semiconductor device when gate line 3d is held at write voltage Vp, and gate lines other than gate line 3d and the left ends of all lanes are held at zero-voltage in the state shown in FIG. 9(a).

Next, gate line 3d is held at write voltage Vp, while gate lines other than gate line 3d and the left ends of all lanes are held at zero-voltage, as shown in FIG. 9(b). Since three-terminal variable resistance switching element 11ad is already weakly shut off, voltage Vp is still held at bus holder 5ae on the right side thereof. Then, since the source electrode side of three-terminal variable resistance switching element 11ad is reduced to zero-voltage, precipitated metal 25 of three-terminal variable resistance switching element 11ad completely disappears after a certain period of time passes, causing three-terminal variable resistance switching element 11ad to change into a completely shut-off state. In FIGS. 9(a) and 9(b), the state remains unchanged except for three-terminal variable resistance switching element 11ad. This is a fourth stage.

While the foregoing description has been given of a method of shutting off only three-terminal variable resistance switching element 11ad, it is possible to simultaneously shut off other three-terminal variable resistance switching elements 11Xd which share gate line 3d. Specifically, in the procedure described with reference to FIG. 9(a), write voltage Vp may be applied to a left end of a lane which includes three-terminal variable resistance switching element 11XY which is to be shut off. This method can simultaneously shut off three-terminal variable resistance switching elements 11XY which share gate line 3d in a desired pattern. Notably, the procedure described with reference to FIG. 9(b) is the same in an arbitrary shut-off pattern.

A description will be given of a method of further bringing three-terminal variable resistance switching element 11bc into a shut-off state after the procedure described in FIGS. 9(a) and 9(b).

FIG. 10(a) is a diagram for describing the operation of the semiconductor device when gate line 3c corresponding to three-terminal variable resistance switching element 11bc, which is to be shut off, is set to zero-voltage, and the remaining gate lines are all set to write voltage Vp in a method of further bringing three-terminal variable resistance switching element 11bc into a shut-off state after the procedure described in FIGS. 9(a) and 9(b).

First, gate line 3c corresponding to three-terminal variable resistance switching element 11bc, which is to be shut off, is set to zero-voltage, while the remaining gate lines are all set to write voltage Vp, as shown in FIG. 10(a). At the same time, write voltage Vp is applied to a left end of a lane which includes three-terminal variable resistance switching element 11bc which is to be shut off, and left ends of the remaining lanes are set to voltage 0. After the lapse of a certain period of time during which this state is maintained, three-terminal variable resistance switching element 11bc changes into a weakly shut-off state, but the conductive state of the other three-terminal variable resistance switching elements does not change. In this event, bus holder 5bd positioned on the right side of three-terminal variable resistance switching element 11cb is holding voltage Vp.

Figure 10B:
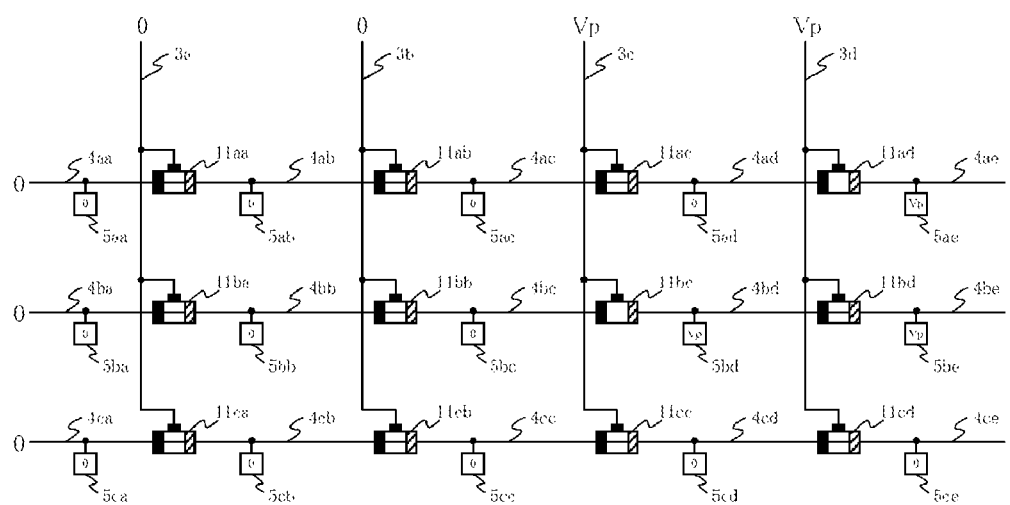
[FIG. 10(b)]

FIG. 10(b) is a diagram for describing the operation of the semiconductor device when gate line 3c of three-terminal variable resistance switching element 11bc, which is to be shut off, and gate line 3d on the right side thereof are set to write voltage Vp, and the remaining gate lines and left ends of all lanes are set to zero-voltage in the state shown in FIG. 10(a).

Next, gate line 3c of three-terminal variable resistance switching element 11bc, which is to be shut off, and gate line 3d on the right side thereof are set to write voltage Vp, while the remaining gate lines and left ends of all lanes are set to zero-voltage, as shown in FIG. 10(b). Since three-terminal variable resistance switching element 11bc is already weakly shut off, voltage Vp is still held at bus holder 5bd on the right side thereof. Then, since the voltage of source electrode side of three-terminal variable resistance switching element 11bc is reduced to zero-voltage, precipitated metal 25 of three-terminal variable resistance switching element 11bc completely disappears after a certain period of time passes, causing three-terminal variable resistance switching element 11bc to change into a completely shut-off state. In this procedure, the conductive state remains unchanged except for three-terminal variable resistance switching element 11bc.

It is possible to also shut off other three-terminal variable resistance switching elements 11Xc which share gate line 3c with three-terminal variable resistance switching element 11bc in a similar manner. Specifically, write voltage Vp may be applied to the left end of the lane which includes a three-terminal variable resistance switching element which is to be shut off in the procedure described with reference to FIG. 10(a). This method can simultaneously shut off three-terminal variable resistance switching elements 11Xc which share gate line 3c in a predetermined pattern. The procedure described with reference to FIG. 10(b) is the same in an arbitrary shut-off pattern.

The procedure described with reference to FIGS. 9(a)-9(b) is an exemplary procedure for configuring three-terminal variable resistance switching elements on the right-most column. The procedure described with reference to FIGS. 10(a)-10(b) in turn is an exemplary procedure for configuring three-terminal variable resistance switching elements on the second column from the right. Subsequently, this procedure is performed in a similar manner until the right end is reached by moving columns intended for the configuration one by one to the left. In this way, the configuration is accomplished for all three-terminal variable resistance switching elements 11XY.

When bus holder 5XY is driven from an end of a lane which includes bus holder 5XY or from another gate, bus holder 5XY readily changes a value held therein in accordance with their voltage values. However, when bus holder 5XY is connected to a drain (or source) electrode of weakly shut-off three-terminal variable resistance switching element 11XY, a value held by bus holder 5XY does not change irrespective of the voltage on the source (or drain) electrode of that three-terminal variable resistance switching element 11XY. The driving force of an inverter (60a in FIG. 7) which forms part of bus holder 5XY must be set such that bus holder 5XY has such characteristics.

Figure 1:
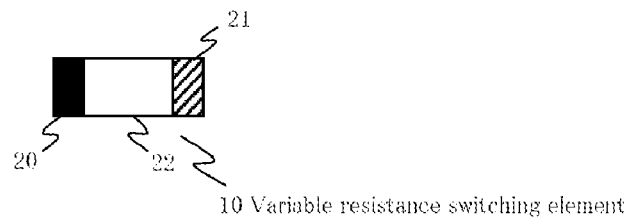
[FIG. 1]
A diagram showing an exemplary configuration of a variable resistance switching element.
Figure 2A:
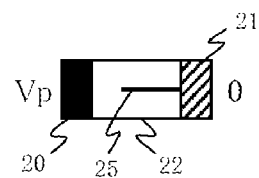
[FIG. 2(a)]
A diagram showing the operation of the variable resistance switching element shown in FIG. 1 when the source electrode is applied with write voltage Vp, and the drain electrode is set to voltage 0.
Figure 2B:
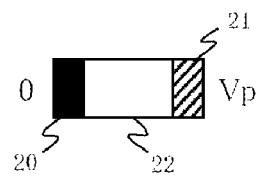
[FIG. 2(b)]
A diagram showing the operation of the variable resistance switching element in the state shown in FIG. 2(a) when the source electrode is set to voltage 0, and the drain electrode is applied with voltage Vp.
Figure 3:
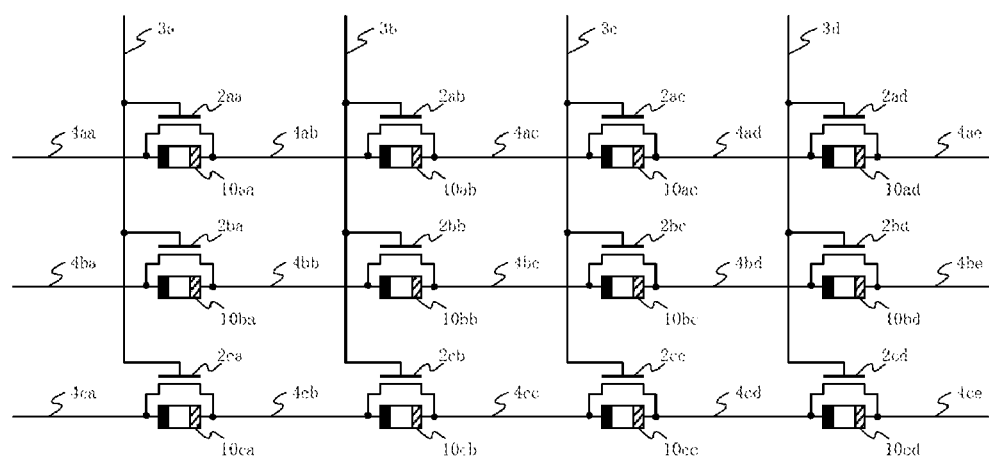
[FIG. 3]
A diagram showing an exemplary configuration of a semiconductor device which comprises a reconfigurable wiring network using the variable resistance switching elements shown in FIG. 1.

This bus holder 5XY is not provided exclusively for configuration, but is required as well when the reconfigurable wiring network is operated and used (normal mode). In a reconfigurable wiring network, wiring segments 4XY are electrically connected or disconnected in a desired pattern through variable resistance switching elements. Accordingly, some wiring segments are not connected to anywhere or are not driven from anywhere, so that such wiring segments frequently suffer from instable voltage levels, i.e., end up in a so-called floating state. In such an event, bus holder 5XY, if connected to wiring segment 4XY, can clamp the voltage level to a logic value 1 or 0 and prevent the wiring segments from floating. By thus adapting bus holder 5XY for the prevention of floating to the configuration of three-terminal variable resistance switching element 11XY, no additional parts are substantially required for the configuration, without causing an increase in circuit area. On the other hand, the form shown in the FIG. 3 implies a problem in which the circuit area is increased because extra MOS transistors 2XY must be added only for configuration.

Also, FIG. 6 has illustrated three-terminal variable resistance switching elements 11XY arranged in a regular two-dimensional lattice form of three rows and four columns with all wiring segments having the same length. However, this is a mere example, and in the first embodiment of the present invention, the three-terminal variable resistance switching elements may be arranged in an arbitrary number of rows and columns. Additionally, three-terminal variable resistance switching elements 11XY need not be arranged in a regular two-dimensional lattice form, and it is not necessary for either of the wiring segments to have the same length.

Figure 11:
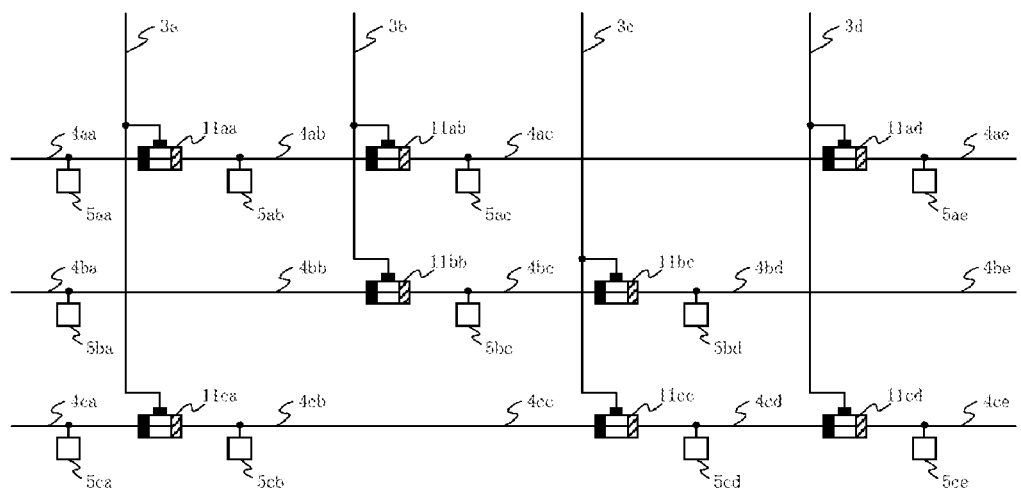

FIG. 11 is a diagram showing a semiconductor device which comprises a reconfigurable wiring network that has three-terminal variable resistance switching elements 11XY arranged in an irregular manner.

The configuration can be accomplished in the same method as the aforementioned method even if wiring segments having different lengths (for example, such as 4ab and 4ac) are mixed, or even if three-terminal variable resistance switching elements 11XY are arranged from place to place in a two-dimensional lattice, for example, as shown in FIG. 11.

(Second Embodiment)

Figure 12:
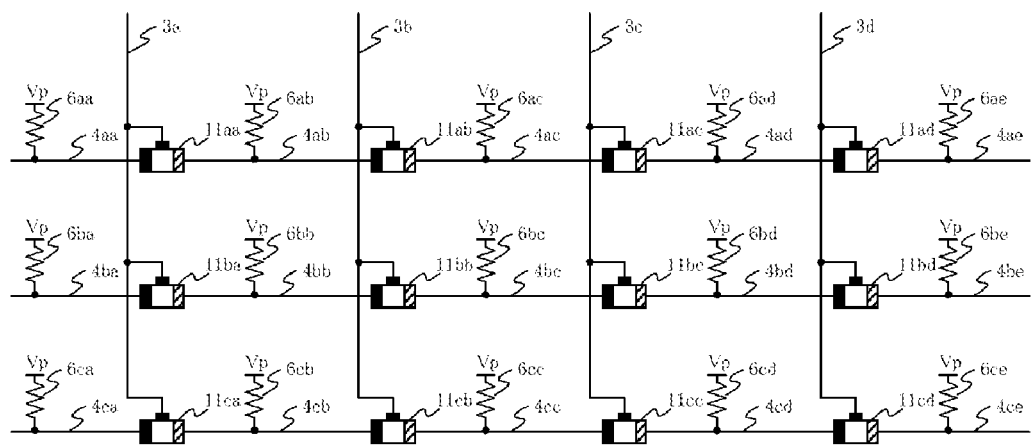

FIG. 12 is a diagram showing a second embodiment of a semiconductor device which comprises a reconfigurable wiring network using three-terminal variable resistance switching elements 11 shown in FIG. 4.

As shown in FIG. 12, this embodiment comprises pull-up resistor 6XY at voltage Vp, which is substituted for bus holder 5XY in the reconfigurable wiring network in the first embodiment shown in FIG. 6. In other words, in the second embodiment, pull-up resistor 6XY is comparable to the potential holding section described in the first embodiment.

The reconfigurable wiring network shown in FIG. 12 performs the same operation as the reconfigurable wiring network of the first embodiment described above. Specifically, the configuration method described in the first embodiment of the present invention can be applied as is to the reconfigurable wiring network in the second embodiment of the present invention. Pull-up resister 6XY at voltage Vp in the second embodiment of the present invention plays the same role as bus holder 5XY in the first embodiment of the present invention, and not only functions during configuration but also functions to prevent floating in a normal mode.

When wiring segment 4XY connected to pull-up resistor 6XY is driven from the end of a lane which includes this wiring segment 4XY or from another gate, the voltage value readily changes in accordance with their signal values. However, when wiring segment 4XY connected to pull-up resistor 6XY is connected to a drain (or source) electrode of weakly shut-off three-terminal variable resistance switching element 11XY, the voltage value of wiring segment 4XY remains unchanged depending on the voltage at the source (or drain) electrode of this three-terminal variable resistance switching element 11XY. The resistance value of pull-up resistor 6XY must be set such that pull-up resistor 6XY has such characteristics.

Also, the reconfigurable wiring network in the second embodiment of the present invention is similar to the reconfigurable wiring network shown in FIG. 11 in that wiring segments of different lengths may be mixed, or in that three-terminal variable resistance switching elements may exist in part of a two-dimensional lattice.

While the present invention has been described with reference to some embodiments thereof, the present invention is not limited to the foregoing embodiments. The present invention can be modified in configuration and details in various manners which can be understood by those skilled in the art within the scope of the present invention.

This application is the National Phase of PCT/JP2008/066216, filed on Sep. 9, 2008, which claims the priority based on Japanese Patent Application No. 2007-301480 filed Nov. 21, 2007, the disclosure of which is incorporated herein by reference in its entirety.

The invention claimed is:

1. A configuration method for configuring a semiconductor device, wherein:
   said semiconductor device comprises L (L is a natural number) lanes, each said lane including a plurality of three-terminal variable resistance switching elements each having a source electrode, a drain electrode, and a gate electrode and connected to each other in series, wiring segments through which said three-terminal variable resistance switching element has the source electrode connected to the drain electrode of a three-terminal variable resistance element adjacent to said three-terminal variable resistance switching element; a plurality of potential holding sections connected to said wiring segments for holding a predetermined potential; and a common gate line connected to each of the gate electrodes of three-terminal variable resistance switching elements belonging to a column group, said column group comprised of three-terminal variable resistance switching elements, each of which is arranged in each of said lanes, said configuration method comprising:

a first step of holding a first end on a source side of said each lane at a predetermined write voltage with respect to a second end on a drain side of said each lane to a moment at which conduction is established from said first end to said second end;

a second step of holding all said gate lines at the write voltage with respect to said first ends, subsequent to said first step;

a third step, subsequent to said second step, of holding the first end of a lane to which a desired three-terminal variable resistance switching element is connected and gate lines other than a gate line to which said desired three-terminal variable resistance switching element is connected at the write voltage, until a resistance value, between the first end and said second end of the lane to which said desired three-terminal variable resistance switching element is connected, grows to a larger value than a resistance value between said first end and said second end at the instant when conduction is established between said first end and said second end in said first step; and a fourth step of holding the gate line to which said desired three-terminal variable resistance switching element is connected at the write voltage, subsequent to said third step.

2. The configuration method according to claim 1, wherein:
said potential holding section is a bus holder for storing one-bit information.

3. The configuration method according to claim 2, wherein:
said bus holder holds said wiring segment at a voltage corresponding to logic value 0 or 1 when said wiring segment connected to said bus holder is not driven by another gate.

4. The configuration method according to claim 1, wherein:
said potential holding section is a pull-up resistor for pulling up the potential of said wiring segment.

5. The configuration method according to claim 4, wherein:
said pull-up resistor holds said wiring segment at a voltage corresponding to logic value 1 when said wiring segment connected to said pull-up resistor is not driven by another gate.

6. The configuration method according to claim 1, wherein:
a j-th (j is a natural number from one to said L) one of said lanes includes $N_j$ (N is a natural number) of said three-terminal variable resistance switching elements,
an i-th (i is a natural number from one to $N_j$) one of said three-terminal variable resistance switching elements has the drain electrode connected to a drain end of an (i+1)th one of said wiring segments,
said i-th one of said three-terminal variable resistance switching elements has the source electrode connected to a source end of said i-th one of said wiring segments,
said first end of said j-th lane is a drain end of a first one of said wiring segments, and
said second end of said j-th lane is a source end of an $(N_j+1)$th one of said wiring segments.

7. The configuration method according to claim 1, wherein:
an i-th (i is a natural number from one to $N_j$) one of said three-terminal variable resistance switching elements in said j-th (j is a natural number from one to said L) one of said lanes belongs to an $(X\_i\_j)$th one of said column groups, where said $X\_i\_j$ is an integer number which satisfies $X\_i\_j < X\_(i+1)\_j$.

8. The configuration method according to claim 1, wherein:
said third step brings said three-terminal variable resistance switching element into a weakly shut-off state by holding the write voltage for a predetermined time.

9. The configuration method according to claim 1, wherein:
said fourth step holds the gate line to which said desired three-terminal variable resistance switching element is connected and all said gate lines positioned between said gate line and said second end of said lane at the write voltage for a predetermined time, and simultaneously holds the rest of said gate lines and the first ends of all said lanes at voltage 0 for a predetermined time, thereby bringing said three-terminal variable resistance switching element into a strongly shut-off state.

10. The configuration method according to claim 1, wherein:
said gate electrode of said three-terminal variable resistance switching element is shut off from said source electrode and said drain electrode at all times.

11. The configuration method according to claim 1, wherein:
said three-terminal variable resistance switching element in a shut-off state changes into a weakly conductive state where a resistance value that is presented between said source electrode and said drain electrode is larger than a predetermined threshold, when said source electrode is held in a state of the write voltage with respect to said drain electrode for a predetermined time.

12. The configuration method according to claim 11, wherein:
said three-terminal variable resistance switching element in the weakly conductive state changes into a strongly conductive state where a resistance value that is presented between said source electrode and said drain electrode is smaller than a predetermined threshold, when said gate electrode is held in a state of the write voltage with respect to said source electrode or said drain electrode for a predetermined time.

13. The configuration method according to claim 11, wherein:
said three-terminal variable resistance switching element in a conductive state changes into a weakly shut-off state where a resistance value that is presented between said source electrode and said drain electrode is larger than the resistance value in the weakly conductive state, when said source electrode or said drain electrode is held in a state of the write voltage with respect to said gate electrode for a predetermined time.

14. The configuration method according to claim 13, wherein:
said three-terminal variable resistance switching element in the weakly shut-off state changes into a strongly shut-off state where a resistance value that is presented between said source electrode and said drain electrode is larger than the resistance value in the weakly shut-off state, when said drain electrode is held in a state of the write voltage with respect to said source electrode for a predetermined time.

* * * * *